(12) United States Patent
Abe

(10) Patent No.: US 6,639,400 B2
(45) Date of Patent: Oct. 28, 2003

(54) METHOD AND APPARATUS FOR MEASURING MAGNETIC HEAD

(75) Inventor: Masayuki Abe, Fuchu (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 10/228,189

(22) Filed: Aug. 27, 2002

(65) Prior Publication Data

US 2003/0042896 A1 Mar. 6, 2003

(30) Foreign Application Priority Data

Aug. 31, 2001 (JP) .................................... 2001-264357
Sep. 14, 2001 (JP) .................................... 2001-280638

(51) Int. Cl.[7] ............................................. G01R 33/12
(52) U.S. Cl. .................... 324/210; 324/212; 324/263
(58) Field of Search ................................ 324/210–212, 324/232, 235, 263; 29/593; 338/32 R; 250/306; 73/105

(56) References Cited

U.S. PATENT DOCUMENTS

| | | | |
|---|---|---|---|
| 5,652,377 A | * 7/1997 | Yagi | 73/105 |
| 5,721,488 A | * 2/1998 | Sakai et al. | 324/210 |
| 5,854,554 A | * 12/1998 | Tomita et al. | 324/210 |
| 5,918,274 A | * 6/1999 | Chen et al. | 73/105 |
| 5,936,789 A | * 8/1999 | Mukohara | 360/77.04 |
| 6,437,562 B2 | * 8/2002 | Abe | 324/210 |

OTHER PUBLICATIONS

U.S. patent application Ser. No. 10/062,571, Abe, filed Feb. 5, 2002.
U.S. patent application Ser. No. 09/811,771, Abe, filed Mar. 20, 2001.
Proksch et al., "measuring the gigahertz response of recording heads with the magnetic force microscope", 1999 Am Institute of Physics, pps 1308–1310.
Sueoka et al., "Direct Measurement of the Sensitivity Distribution of Magnetoresistive Heads by the SXM Technique," 1992 IEEE Transactions on Magnetics, vol. 28, No. 5, Sep. 1992, pps. 2307–2309.
Gibson et al., "Spatial Mapping of the Sensitivity Function of Magnetic Recording Heads Using a magnetic Force microscope as a Local Flux Applicator," 1992 IEEE, vol. 28, No. 5, pps 2310–2311.
Ohmori, "Techniques for Analysis of Magnetic Recording Heads and Mgnetoresistive Heads," Magnetic Journal, vol. 23, No. 12, 1999, pps 2111–2116.
Abe et al., "High Frequency write head measurement with the phase detection magnetic force microscope," 2001 Am Institute of Physics, Jun. 1, 2001, vol. 89, No. 11, pps. 6766–6768.

* cited by examiner

Primary Examiner—N. Le
Assistant Examiner—Reena Aurora
(74) Attorney, Agent, or Firm—Pillsbury Winthrop LLP

(57) ABSTRACT

In a magnetic head measuring apparatus for measuring a magnetic head, an amplitude-modulated electric current whose amplitude is modulated by a specified carrier wave frequency and modulation frequency is applied to a magnetic head. A calibrating magnetic field generating source causes the magnetic head to generate a magnetic field having a specified strength and frequency, thereby calibrating measurement variations of the magnetic head. A magnetic head measuring device measures a high-frequency magnetic field generated from the magnetic head. If necessary, an interchangeable magnetic material probe is used to replace a probe of the magnetic head measuring device.

27 Claims, 13 Drawing Sheets

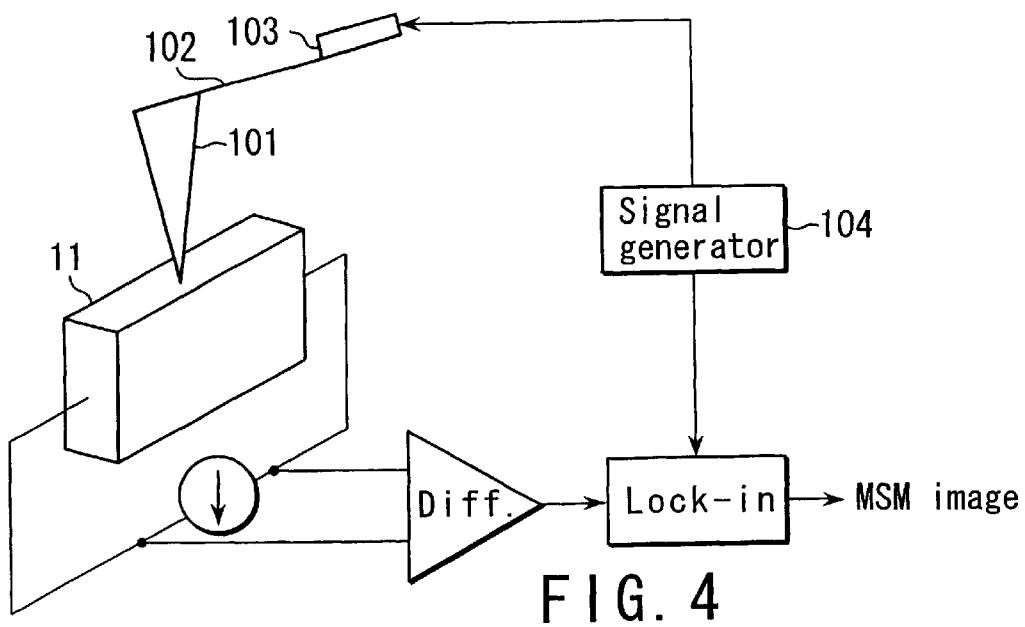
FIG. 4
MFM Image Date:Jul092001
Filename:T0709.F03
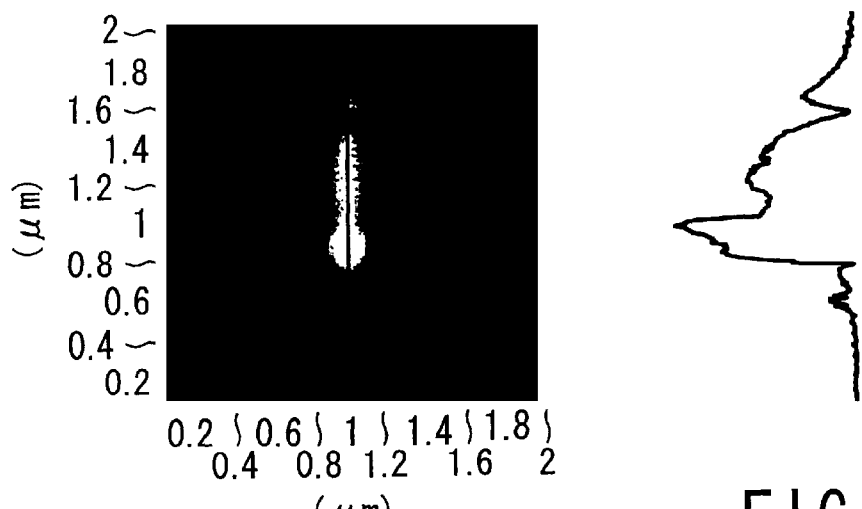
FIG. 5A
FIG. 5B

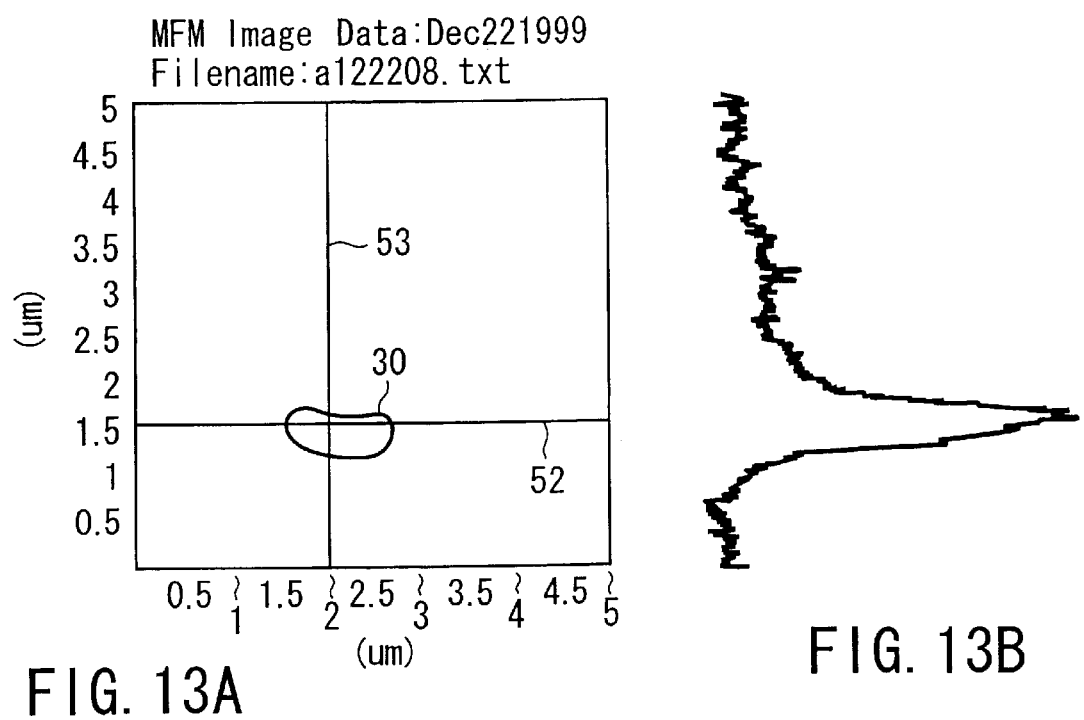
FIG. 13A
FIG. 13B
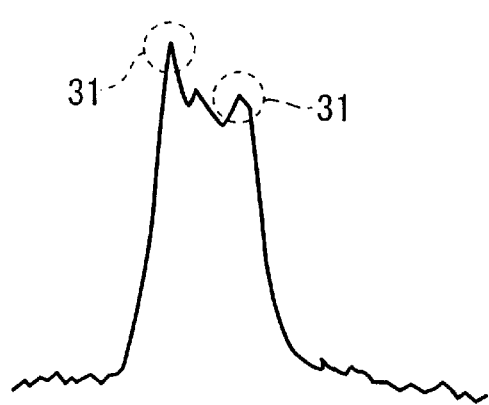
FIG. 13C

METHOD AND APPARATUS FOR MEASURING MAGNETIC HEAD

CROSS-REFERENCE TO RELATED APPLICATIONS

This application is based upon and claims the benefit of priority from the prior Japanese Patent Applications No. 2001-264357, filed Aug. 31, 2001; and No. 2001-280638, filed Sep. 14, 2001, the entire contents of both of which are incorporated herein by reference.

BACKGROUND OF THE INVENTION

1. Field of the Invention

The present invention relates to a magnetic head measuring apparatus for measuring a magnetic head.

2. Description of the Related Art

A magnetic force microscope (MFM) is often used in inspecting a magnetic head. For example, the following inspection method used in a thin-film magnetic head wafer inspection process is known. That is, with a plurality of thin-film magnetic heads formed on a wafer, a groove is formed in a surface on which a medium and the head gap of each thin-film magnetic head are in contact with each other. A probe of the MFM is inserted into this groove to inspect the shape of the head gap surface and the electromagnetic conversion characteristic of the thin-film magnetic head.

The MFM is a kind of a scanning probe microscope (SPM), and is an apparatus which detects a dynamic interaction between a pointed probe (MFM probe) which is a magnetic material, or a nonmagnetic material to which a magnetic material is adhered, and a magnetic field generated from a sample to be measured. The resolution is as very high as several tens of nm, although it depends upon the measurement method and the probe shape. Therefore, this MFM is very effective in magnetic characteristic evaluation on submicron order.

The MFM probe is supported by a leaf spring called a cantilever and has a mechanical resonance frequency determined by the mass of the MFM probe and the sprint constant of the cantilever. Accordingly, in MFM measurements in a normal mode, responses at frequencies higher than this mechanical resonance frequency (generally a few tens of kHz to a few hundred kHz) cannot be measured in the case where the response is measured by applying sinusoidal wave.

In the above inspection method, the MFM measurement is performed while applying a sinusoidal high-frequency electric current to the recording head. However, no desired response can be obtained from the measured MFM signal owing to the above limitation; a high-frequency component is contained in a DC signal. Also, the DC component of the measured MFM signal contains contribution from factors other than the head, e.g., an MFM interaction caused by a DC magnetic field generated from the head magnetic pole. Under the measurement conditions like this, the distribution of a true magnetic field generated from the magnetic head cannot be measured. In other words, strict magnetic head inspection is difficult to perform.

Furthermore, in MFM measurements, measurement values vary owing to tip variations when the MFM probes are changed (in some cases measurement values vary even for the same magnetic head as a sample to be measured). One reason is that the conditions (e.g., the shape, film thickness, and contamination) of a magnetic material at the tip of the MFM probe more or less change from one probe to another. Other reasons are variations in an optical system alignment for measuring the deflection of the cantilever supporting the MFM probe, and detection sensitivity variations caused by a difference in reflectance between thin metal films adhered to the back surface of the cantilever and required in the optical system alignment.

When the foregoing facts are taken into consideration, it is necessary to compensate for the influence of tip variations in the process of inspecting a large amount of magnetic heads. However, the above-mentioned references do not describe any method of solving this problem.

As described above, the conventional methods have the problems that no true high-frequency magnetic field can be measured, and the obtained measurement data have measurement variations caused by tip variations.

Also, electromagnetic conversion measurement for a magnetic head is conventionally performed using, e.g., a spin stand. This measurement must be performed with a magnetic head in the form of HGA (Head Gimbals Assembly). That is, since magnetic heads including defective ones are measured in the form of HGA, the yield cannot be improved unlimitedly.

From the foregoing, the presentation of a magnetic head inspection technology that can reduce measurement variations caused by tip variations and which can improve the yield is desired.

In the meantime, a magnetic recording-head as a sample to be measured by a magnetic head measuring device is, e.g., an inductive type thin-film head and has a magnetic gap that generates a recording magnetic field corresponding to a signal current applied to a coil. The magnetic head measuring device applies a high-frequency signal current to (the coil) of a head as a sample, and measures the distribution of a magnetic field generated from the magnetic gap. One practical measurement method is to detect the phase or deflection (dynamic interaction resulting from a head magnetic field) of a cantilever vibrating and, on the basis of this detection result, measure the force gradient or force acting between the probe and the sample. In this method, measurement is performed using the relationship that the phase of the cantilever approximates the force gradient and the deflection of the cantilever approximates the force.

This measurement method has wide variations. For example, R. Proksch et al., "Measuring the gigahertz response of recording heads with the magnetic force microscope", (Digital Instruments et al.), Applied Physics Letters, Vol. 74, No. 9, March 1999, pp. 1308–1310 (to be referred to as prior art 1 hereinafter) discloses a technique which applies an amplitude-modulated electric current to a magnetic recording-head and matches the modulation frequency to the resonance frequency of the cantilever, thereby detecting the resonance frequency component of the deflection (or force) of the cantilever vibrating. This technique improves the sensitivity by using the Q value of the mechanical resonance frequency of the cantilever.

Also, Hiroyuki Ohmori, "Techniques of Evaluating and Analyzing Recording and Reproduction Heads", SONY CORP., Journal of Japan Applied Magnetics Society, Vol. 23, No. 12, 1999, pp. 2111–2117 (to be referred to as prior art 2 hereinafter) discloses a technique which applies a high-frequency sinusoidal wave to a magnetic recording-head and measures the DC component of the phase change (force gradient) of the cantilever, resulting from a magnetic field generated around the head.

In prior art 1, however, the deflection of the cantilever is detected as magnetic field strength. Therefore, the vibration amplitude of the cantilever is not constant during probe scanning. In the case of the measurement which detects dynamic deflection of the cantilever such as the measurement in prior art 1, detected interaction on the probe depends on the cantilever amplitude, probe-sample distance, magnetic field and so on. Therefore, cantilever amplitude and probe-sample distance need to be constant during probe scanning, since magnetic field decays non-linearly. So an image reflecting a magnetic field cannot be measured. In addition, the sensitivity is improved by using the Q value of the mechanical resonance frequency of the cantilever. However, a high Q value may produce a response delay in a change of the cantilever.

On the other hand, prior art 2 measures the DC component of the phase change (force gradient) of the cantilever, resulting from a magnetic field generated around a head. However, this DC component contains contributions other than the high-frequency component, so the obtained data is difficult to analyze.

In either method, the frequency of a magnetic field generated from a magnetic recording-head is on the MHz order, i.e., much higher than the cantilever mechanical resonance frequency which determines the response speed of the scanning probe microscope. This makes it difficult to extract only a high-frequency response and measure this response at high sensitivity and high resolution.

From the foregoing, the presentation of a magnetic recording-head measurement technique capable of measuring a high-speed response at high sensitivity and high resolution is desired.

BRIEF SUMMARY OF THE INVENTION

Accordingly, it is an object of the present invention to provide a magnetic head measuring apparatus capable of measuring a high-speed response at high sensitivity and high resolution, and a magnetic head measuring method.

According to one aspect of the present invention, there is provided a magnetic head measuring apparatus for measuring a magnetic head, comprising a calibrating magnetic field generating source which causes the magnetic head to generate a magnetic field having a constant strength and frequency; an electric current applying device which applies an amplitude-modulated electric current whose amplitude is modulated by a specified carrier wave frequency and modulation frequency, to the magnetic head from which the magnetic field is generated by the calibrating magnetic field generating source; and a magnetic head measuring device which measures a high-frequency magnetic field generated from the magnetic head by application of the amplitude-modulated electric current from the electric current applying device.

According to another aspect of the present invention, there is provided a method of inspecting a magnetic head, comprising setting the magnetic head; selecting an analysis item for which the magnetic head is to be inspected; applying to the magnetic head an amplitude-modulated electric current whose amplitude is modulated by a specified carrier wave frequency and modulation frequency; measuring, in accordance with the selected analysis item, the magnetic head to which the amplitude-modulated electric current is applied, by using a high-frequency magnetic force microscope; analyzing and evaluating data, obtained by the measurement, of the magnetic head; and determining success or failure of the magnetic head on the basis of the evaluation result.

According to still another aspect of the present invention, there is provided a magnetic recording-head measuring apparatus for measuring a magnetic recording-head, comprising an electric current applying device which applies to the magnetic recording-head an amplitude-modulated electric current whose amplitude is modulated by a specified carrier wave frequency and modulation frequency; a cantilever to which a probe having a magnetic material is attached; a vibrator which applies a vibration with specified vibration amplitude to the cantilever; and a measuring device which measures a dynamic interaction which a magnetic field generated in the magnetic recording-head by application of the amplitude-modulated electric current from the electric current applying means exerts on the probe vibrating, wherein while the probe is scanned to measure the dynamic interaction by the magnetic field, a vibration range of the probe falls within a range from a surface of the magnetic recording-head to a point at which the probe does not interact with the magnetic field any longer.

According to still another aspect of the present invention, there is provided a method of measuring a magnetic recording-head, comprising applying to the magnetic recording-head an amplitude-modulated electric current whose amplitude is modulated by a specified carrier wave frequency and modulation frequency; applying a vibration with specified vibration amplitude to a cantilever to which a probe having a magnetic material is attached; and measuring a dynamic interaction which a magnetic field generated in the magnetic recording-head by application of the amplitude-modulated electric current exerts on the probe which vibrates together with the cantilever, wherein while the probe is scanned to measure the dynamic interaction by the magnetic field, a vibration range of the probe falls within a range from a surface of the magnetic recording-head to a point at which the probe does not interact with the magnetic field any longer.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out hereinafter.

BRIEF DESCRIPTION OF THE SEVERAL VIEWS OF THE DRAWING

The accompanying drawings, which are incorporated in and constitute a part of the specification, illustrate embodiments of the invention, and together with the general description given above and the detailed description of the embodiments given below, serve to explain the principles of the invention.

FIG. 4 is a view showing a configuration for acquiring an MSM image in analysis and evaluation of a certain analysis item;

FIGS. 5A and 5B are views showing a two-dimensional image of a high-frequency magnetic field when a magnetic head is viewed from the above, and a line profile of the image;

FIGS. 13A to 13C are graphs showing a force gradient image measurement example of the fifth embodiment;

DETAILED DESCRIPTION OF THE INVENTION

Embodiments of the present invention will be described below with reference to the drawings.

Figure 1:
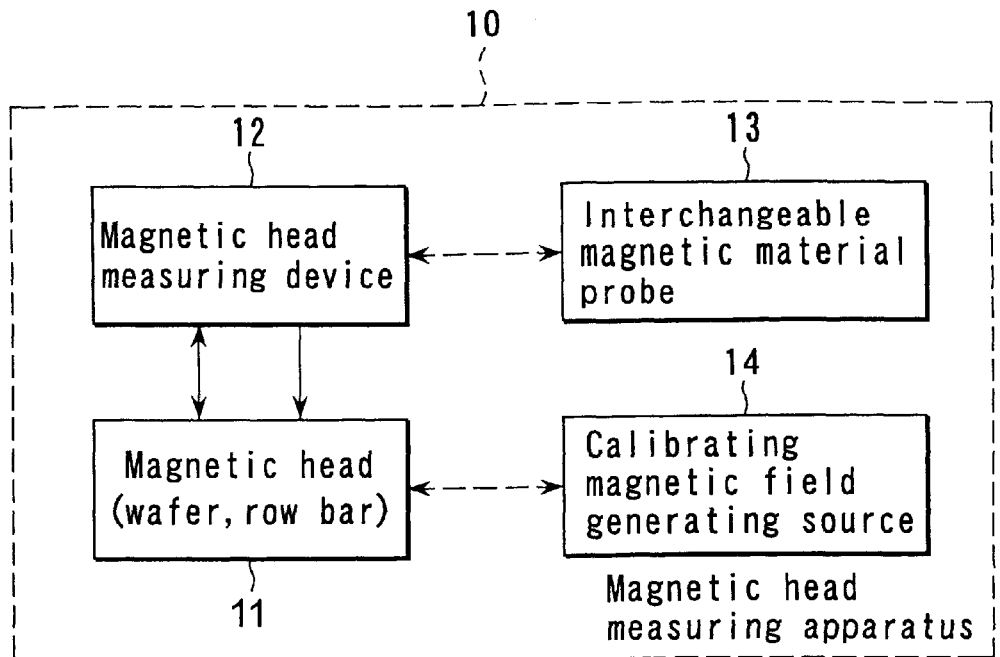
FIG. 1 is a block diagram showing the main components of a magnetic head measuring apparatus according to the first to fourth embodiments of the present invention.

FIG. 1 is a block diagram showing the main parts of a magnetic head measuring apparatus according to the first to fourth embodiments of the present invention.

A magnetic head measuring (or inspecting) apparatus 10 includes a magnetic head measuring (or inspecting) device 12 for measuring (or inspecting) a magnetic head 11 as a sample, an interchangeable magnetic material probe 13 prepared for the magnetic head measuring device 12, and a calibrating (or correcting) magnetic field generating source 14 for calibrating measurement variations of the magnetic head 11.

The magnetic head 11 is supplied in the form of a wafer of row bar, and fixed by a fixing jig of the magnetic head measuring apparatus 10. A "row bar" is a rectangular wafer piece obtained when a wafer is processed into a slider in a magnetic head fabrication process. The magnetic head 11 can also be measured in the form of HGA.

The magnetic head measuring device 12 contains a high-frequency magnetic force microscope (HF-MFM) as one form of a scanning probe microscope (SPM). A difference from a common MFM is that a frequency response higher than the mechanical resonance frequency of a cantilever can be measured. By the use of this HF-MFM, it is possible to perform measurement corresponding to a true high-frequency magnetic field and accurately inspect a magnetic head. Note that the HF-MFM can be constructed using technologies disclosed in R. Proksch and P. Neilson, S. Austvold and J. J. Schmidt, Applied Physics Letters 74 (1999) 1308 (Digital Instruments et. al.), and U.S. patent application Ser. No. 09/811,771.

The magnetic head measuring device 12 can apply an amplitude-modulated electric current to the magnetic head 11. It is of course also possible to apply other signals than this amplitude-modulated electric current. The magnetic head measuring device 12 can also save and analyze data obtained by measuring the characteristics of the magnetic head 12.

To measure the magnetic head 11 at high resolution, the magnetic head measuring device 12 incorporates a magnetic material probe that is a magnetic material or a nonmagnetic material to which a magnetic material is adhered. The interchangeable magnetic material probe 13 is used to replace this probe. Replacement is performed as needed.

The interchangeable magnetic material probe 13 can be used in replacement either manually or automatically. Although this interchangeable magnetic material probe 13 can be saved in the magnetic head measuring apparatus 10, it can also be supplied and used in replacement where necessary, without being saved.

The calibrating magnetic field generating source 14 causes the magnetic head 11 to generate a magnetic field having a constant strength and frequency. This calibrating magnetic field generating source 14 can take any form as long as a uniform magnetic field can be generated. However, flatness that can be measured by the MFM is necessary, and the scanning range is limited (e.g., 50 $\mu$m square or less). The calibrating magnetic field generating source 14 can apply either an alternate current or direct current to the magnetic head 11. From the calibrating magnetic field generating source 14, the magnitude of an actual magnetic field corresponding to the applied electric current can be estimated. Practical examples of the magnetic field generating source are a microcoil, fine wire, and magnetic head formed on general substrates such as Si, $SiO_2$, and silicon nitride.

If a large electric current is allowed to flow through the magnetic head measuring device 12 and the calibrating magnetic field generating source 14, signal lines may be burnt out. Hence, the current density of an electric current to be applied is desirably $10^{-8}$ A/cm$^2$ or less.

Figure 2:
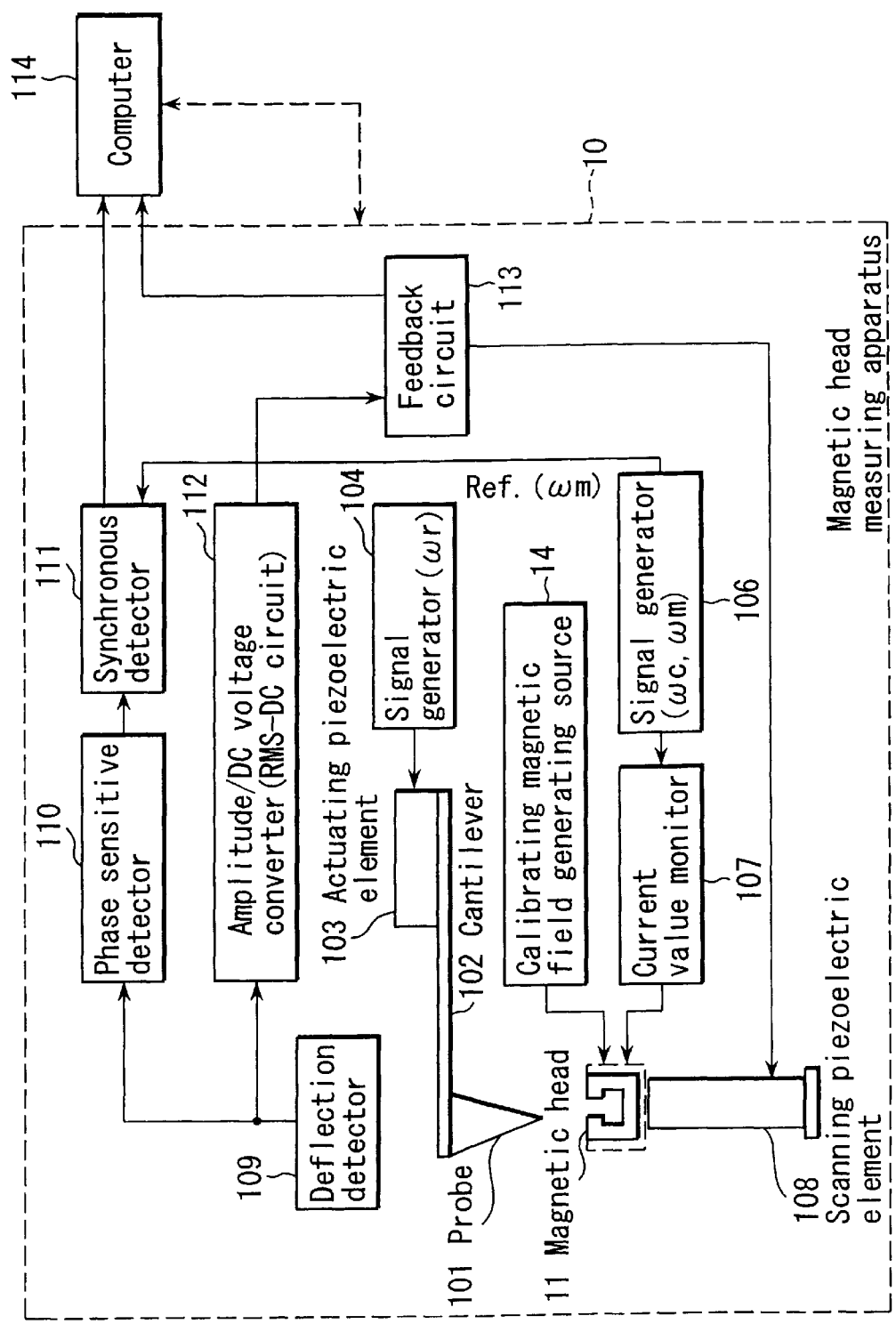
FIG. 2 is a view showing the arrangement of the magnetic head measuring apparatus in more detail.

FIG. 2 is a view showing the arrangement of the magnetic head measuring apparatus 10 in more detail.

In addition to the interchangeable magnetic material probe 13 and the calibrating magnetic field generating source 14, the magnetic head measuring apparatus 10 includes a probe 101, a cantilever 102, a piezoelectric element 103, signal generators 104 and 106, a current value monitor 107, a scanning piezoelectric element 108, a deflection detector 109, a phase sensitive detector 110, a synchronous detector 111, an amplitude/DC voltage converter (RMS-DC circuit) 112, and a feedback circuit 113, as the constituent elements of the magnetic head measuring device 12. The magnetic head measuring apparatus 10 also includes a computer 114.

The probe 101 is an interchangeable MFM probe that is made of a magnetic material or magnetized by adhering a magnetic material to a nonmagnetic material.

The cantilever 102 supports the probe 101.

The piezoelectric element 103 for supporting the cantilever 102 is attached to the side of the cantilever 102 away from the side to which the probe 101 is attached. This piezoelectric element 103 applies a vibration to the probe 101 and the cantilever 102.

The signal generator 104 applies a signal (resonance frequency: $\omega r$) to the piezoelectric element 103.

The signal generator 106 includes an AM signal generator for generating an amplitude-modulated electric current whose amplitude is modulated by a carrier wave frequency $\omega c$ and a modulation frequency $\omega m$, a DC signal generator for generating a direct current, and a signal generator for generating an electric current which is the sum of a direct current and alternate current. This signal generator 106 applies an electric current to the magnetic head 11 to generate a magnetic field.

The current value monitor 107 measures the electric current flowing through the magnetic head 11.

The scanning piezoelectric element 108 determines three-dimensional relative positions of the probe 101 and the magnetic head 11.

The deflection detector 109 detects the deflection of the cantilever 102.

The phase sensitive detector 110 outputs a phase difference (phase shift) between an output from the signal generator 104 and an output from the deflection detector 109.

The synchronous detector 111 detects a component synchronized with the modulation component of the AM signal generator described above, from an output signal from the phase sensitive detector 110.

The amplitude/DC voltage converter (RMS-DC circuit) 112 outputs an effective value (root mean square) of an output from the deflection detector 109.

The feedback circuit 113 controls the scanning piezoelectric element 108 such that the output from the amplitude/DC voltage converter 112 is equal to a preset value (i.e., the probe-to-sample distance is constant).

The computer 114 records and saves information of the high-frequency magnetic field obtained from the output from the synchronous detector 111 and information of the surface shape obtained from the output from the feedback circuit 113, thereby controlling the whole apparatus 10 and monitoring various parameters. This computer 114 can also select analysis items and analyze and evaluate data corresponding to the selected analysis items or determine success or failure of the magnetic head 11.

Magnetic head measurement by the magnetic head measuring apparatus 10 shown in FIG. 2 is basically performed following the procedure below.

First, an electric current whose amplitude is modulated (by the carrier wave frequency ωc and the modulation wavelength ωm) is applied to the magnetic head 11.

When the probe 101 is approached to the magnetic head 11, a high-frequency (ωc) magnetic field component generated by the magnetic head 11 is converted into a low-frequency (ωm) interaction component by the probe-sample interaction.

By setting the resonance frequency ωr and the modulation frequency ωm of the cantilever 102 supporting the probe 101 to meet the condition ωm<<ωr, a component synchronized with the modulation frequency (ωm) contained in a phase change (phase shift) or frequency change (frequency shift, T. R. Albrecht, P. Grutter, D. Horne, and D. Rugar, Journal of Applied Physics, 69 (1991) 668.) of cantilever vibration is measured while the amplitude of the cantilever 102 is held substantially constant at the mechanical resonance frequency (ωr), regardless of the strength of the field, by using the piezoelectric element 103 and an external signal. In this way, a high-resolution, high-frequency magnetic field can be stably measured.

As described above, a true high-frequency magnetic field can be measured by the application of the HF-MFM technology. Also, since the calibrating magnetic field generating source for compensating for tip variations is incorporated into the apparatus, measurement variations can be improved. Furthermore, the electromagnetic conversion characteristics can be measured in the form of a row bar without using any spin stand, and the yield can be improved.

Figure 3:
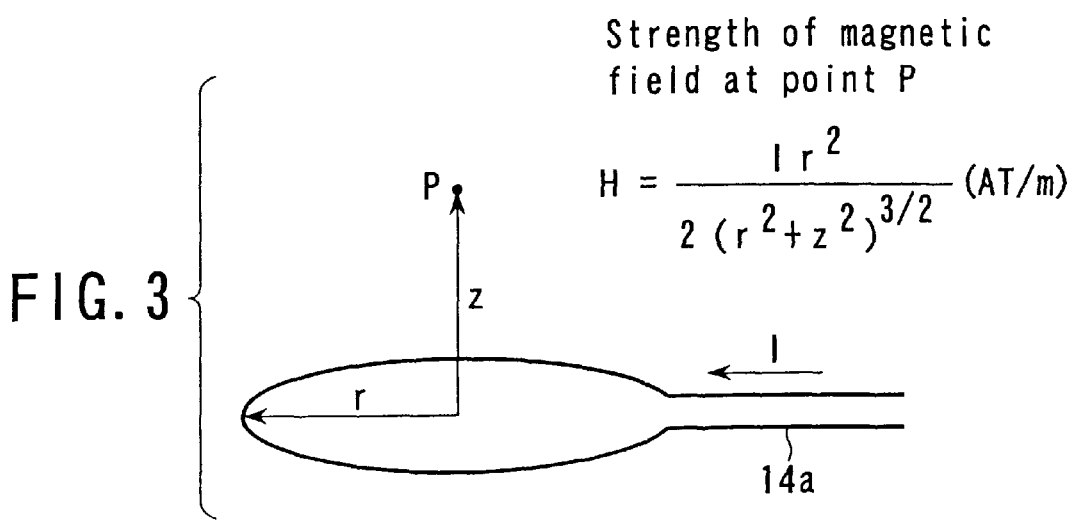
FIG. 3 is a view for explaining a case in which a calibrating magnetic field generating source is an annular conductor.

FIG. 3 is a view for explaining a case in which the calibrating magnetic field generating source is an annular conductor. A calibrating magnetic field generating source 14a shown in FIG. 3 is an annular conductor. Letting r denote the radius of the formed circle and z denote the distance from the center of the circle to a point P, the strength of a magnetic field at this point P when an electric current I flows through the conductor is $H=Ir^2/\{2(r^2+z^2)^{3/2}\}$ (AT/m).

Although FIG. 3 illustrates the annular calibrating magnetic field generating source, it is of course also possible to use some other shape, e.g., a linear shape.

FIG. 4 is a view showing an example of a configuration for acquiring an MSM (Magnetoresistive Sensitive Mapping) image in analysis and evaluation of a certain analysis item. For MSM, refer to "Magnetoresistive Sensitive Mapping" (G. A. Gibson and S. Shultz, IEEE Trans. Magn. 28, 2310 (1992)).

As shown in FIG. 4, while the signal generator 104 is applying a signal to the piezoelectric element 103, a direct current flowing through the magnetic head 11 is extracted through a differential amplifier. Lock-in processing is performed for this extracted signal and the signal from the signal generator 104 to acquire an MSM image.

As shown in FIG. 5A or 5B, this MSM image is acquired in the form of an image or graph. FIG. 5A shows a two-dimensional image of a high-frequency magnetic field when the magnetic head is viewed from the above. FIG. 5B shows a line profile of this two-dimensional image.

First Embodiment

Figure 6:
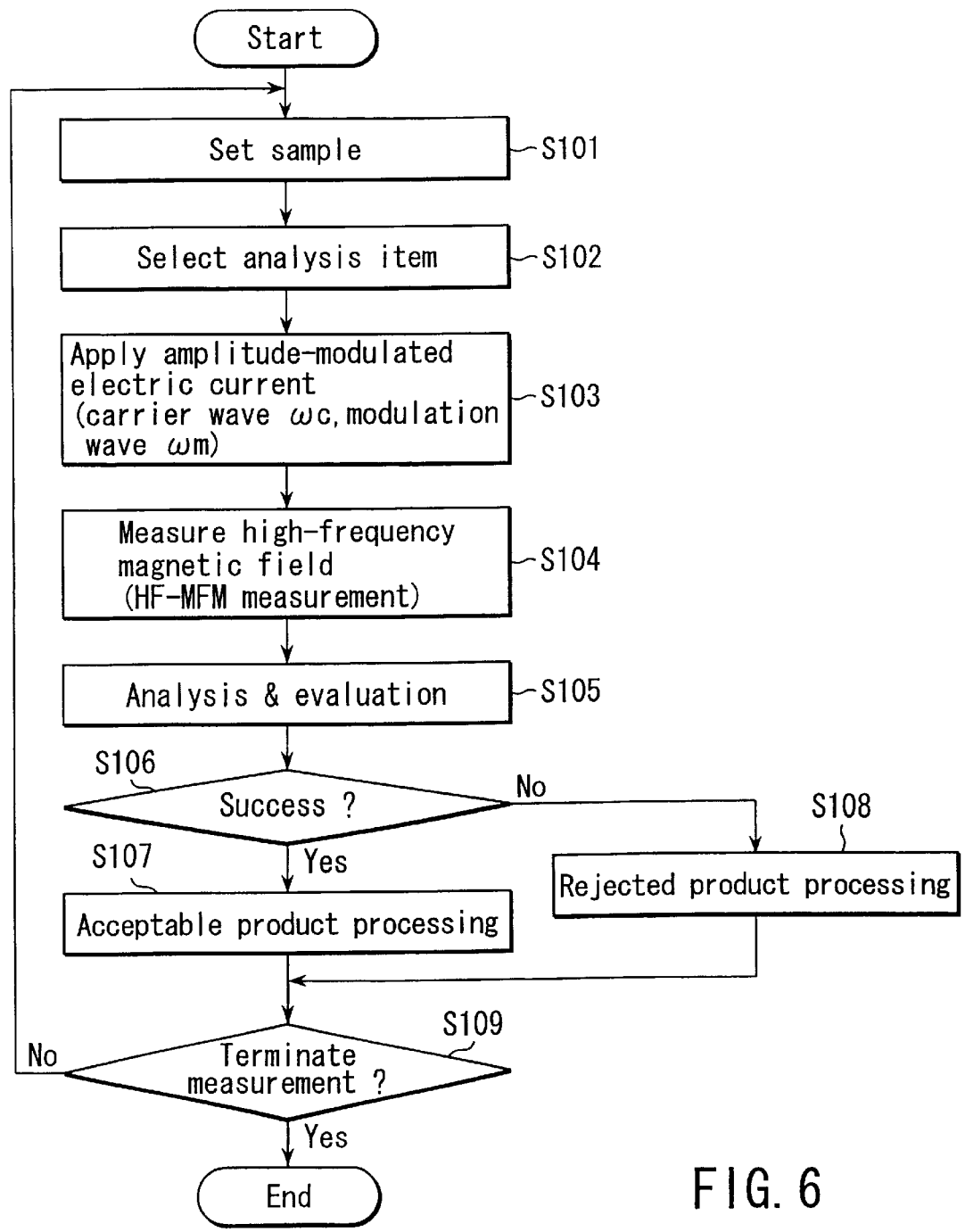
FIG. 6 is a flow chart for explaining a magnetic head inspection method according to the first embodiment of the present invention.

A magnetic head inspection method according to the first embodiment will be explained below with reference to FIG. 6.

First, the magnetic head 11 as a sample is set in the magnetic head measuring apparatus 10 (step S101), and an analysis item for which the magnetic head measuring device 12 inspects the magnetic head 11 is selected (step S102). As this analysis item, not only estimation of a high-frequency magnetic field distribution and local high-frequency magnetic field strength, but also reconstructing calculations of a high-frequency leakage magnetic field and horizontal magnetic field component and prediction of various electromagnetic conversion characteristics are prepared, and an arbitrary item can be selected.

Next, an amplitude-modulated electric current having the carrier wave frequency ωc and the modulation frequency ωm is applied to the magnetic head (step S103), and a high-frequency magnetic field is measured with a high-frequency magnetic force microscope (step S104). A surface shape can also be measured as well as the high-frequency magnetic field. In this case, a magnetic field generation position corresponding to the surface shape can be confirmed.

The data obtained by the measurement of the high-frequency magnetic field is analyzed and evaluated (step S105), and success or failure is determined on the basis of the result (step S106). If the product has passed the inspection, acceptable product processing is performed (step S107); if the product has failed the inspection, rejected product processing is performed (step S108).

Finally, whether to terminate the measurement is checked (step S109). If the measurement is not to be terminated, the above steps are repeated; if the measurement is to be terminated, this magnetic head inspection is terminated.

In this first embodiment, a magnetic head can be inspected before incorporated into an HGA. This can greatly improve the HGA yield.

Second Embodiment

Figure 7:
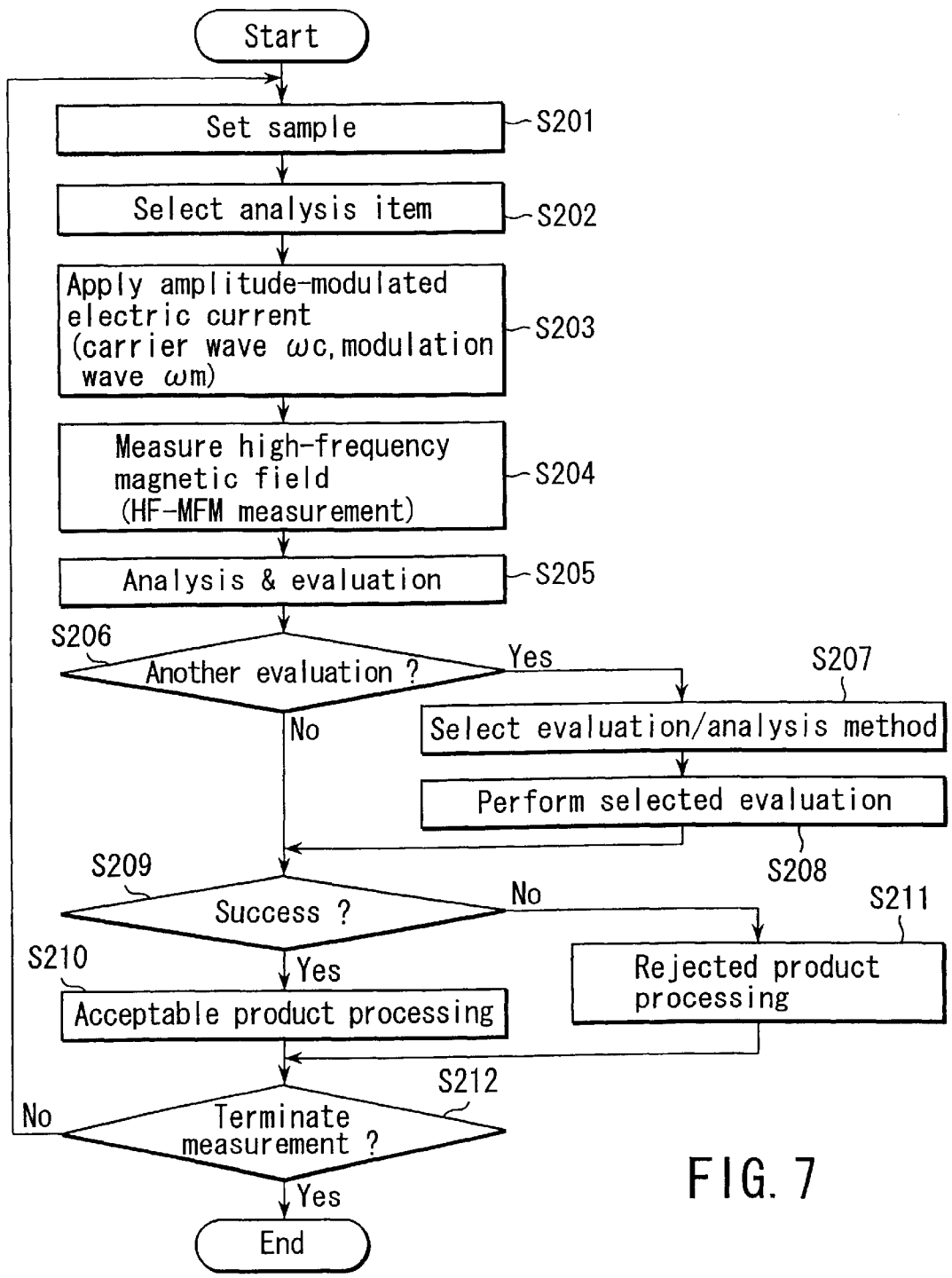
FIG. 7 is a flow chart for explaining a magnetic head inspection method according to the second embodiment of the present invention.

A magnetic head inspection method according to the second embodiment will be explained below with reference to FIG. 7.

This second embodiment includes processing for obtaining characteristics, e.g., the shape and sensitivity of a reproducing portion and a saturated magnetic field phenomenon, not obtained in the first embodiment (FIG. 6) described above.

First, the magnetic head 11 as a sample is set in the magnetic head measuring apparatus 10 (step S201), and an analysis item for which the magnetic head measuring device 12 inspects the magnetic head 11 is selected (step S202). As this analysis item, not only estimation of a high-frequency magnetic field distribution and local high-frequency magnetic field strength, but also reconstructing calculations of a high-frequency leakage magnetic field and horizontal magnetic field component and prediction of various electromagnetic conversion characteristics are prepared, and an arbitrary item can be selected.

Next, an amplitude-modulated electric current having the carrier wave frequency ωc and the modulation frequency ωm is applied to the magnetic head (step S203), and a high-frequency magnetic field is measured with a high-frequency magnetic force microscope (step S204). A surface shape can also be measured as well as the high-frequency magnetic field. In this case, a magnetic field generation position corresponding to the surface shape can be confirmed.

The data obtained by the measurement of the high-frequency magnetic field is analyzed and evaluated (step S205). Also, whether to perform evaluation other than the measurement of the high-frequency magnetic field is checked (step S206).

If evaluation other than the measurement of the high-frequency magnetic field is to be performed, an evaluation/analysis method is selected (step S207), and the evaluation is performed by the selected method (step S208). Examples of the evaluation/analysis method are the measurement and analysis of magnetic head characteristics not obtained by the high-frequency magnetic field alone, such as the measurement of the shape or sensitivity or a reproducing portion by Magnetoresistive Sensitive Mapping (G. A. Gibson and S. Schultz IEEE Trans. Magn. 28, 2310 (1992)), and the analysis of a saturation phenomenon of a recording portion.

Next, success or failure is determined on the basis of the analysis/evaluation result (step S209). If the product has passed the inspection, acceptable product processing is performed (step S210); if the product has failed the inspection, rejected product processing is performed (step S211).

Finally, whether to terminate the measurement is checked (step S212). If the measurement is not to be terminated, the above steps are repeated; if the measurement is to be terminated, this magnetic head inspection is terminated.

This second embodiment has the effect of performing total evaluation including a reproducing head and magnetic saturation characteristics, in addition to the effects obtained in the first embodiment.

Third Embodiment

Figure 8:
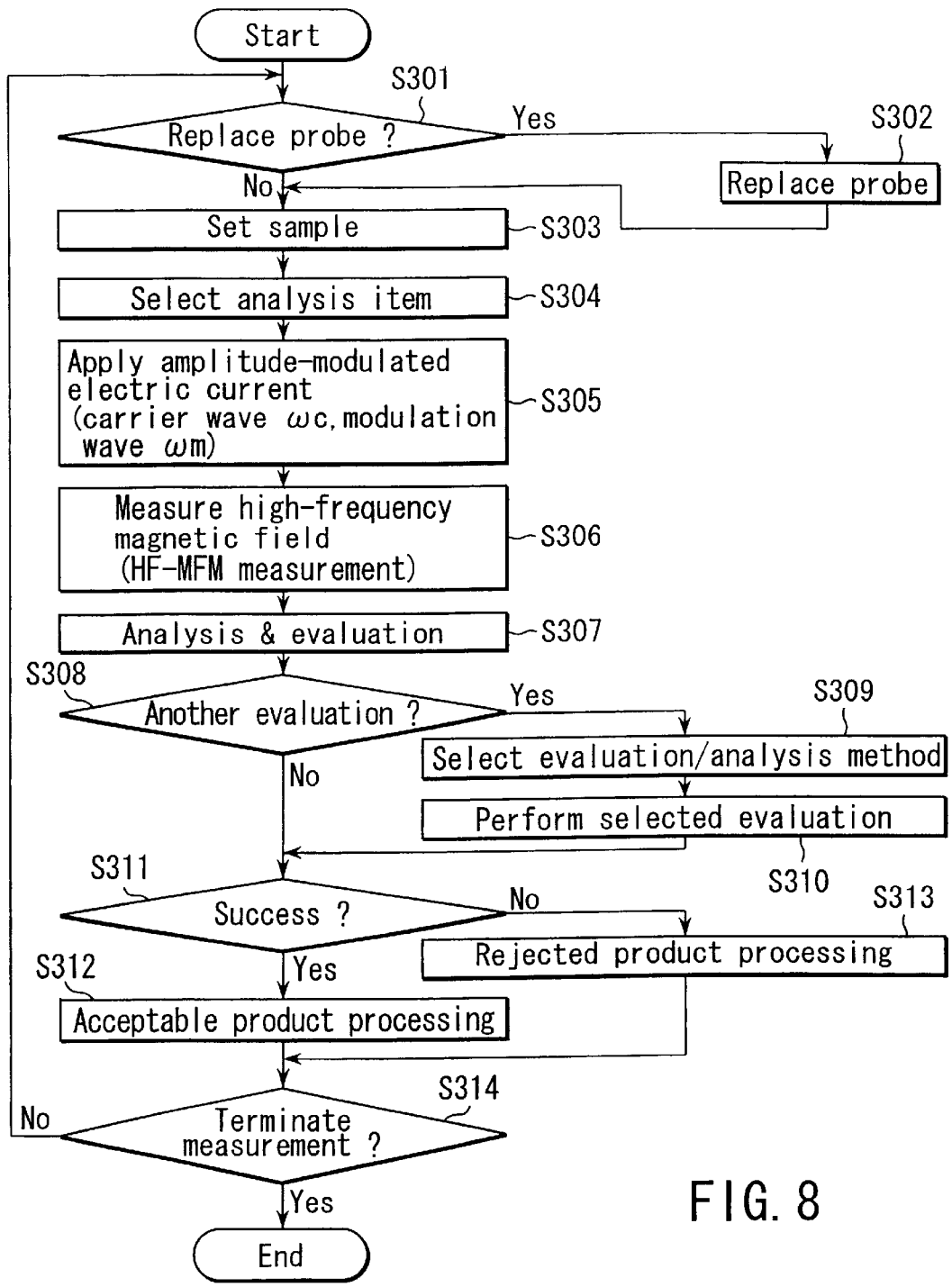
FIG. 8 is a flow chart for explaining a magnetic head inspection method according to the third embodiment of the present invention.

A magnetic head inspection method according to the third embodiment will be described below with reference to FIG. 8.

When measurements are repeatedly performed, no specified inspection results can be obtained in some instances owing to deterioration of the MFM probe, e.g., deterioration of the resolution and a reduction in the S/N ratio of a measurement signal. This "deterioration" herein mentioned includes physical rounding of the probe tip during measurements, peeling of a magnetic film from a probe having the magnetic film attached, and unsuccessful magnetization of a probe. In cases like these, the MFM probe must be replaced with a new one. By taking this into consideration, the third embodiment includes a process of exchanging MFM probes.

First, whether it is necessary to replace the probe mounted on the magnetic head measuring device 12 is checked (step S301). If replacement is necessary, the probe is replaced (step S302). Note that this replacement of the probe can be performed either manually or automatically. Note also that a probe for replacement can be saved in the magnetic head measuring apparatus 10 or supplied where necessary without being saved.

Next, the magnetic head 11 as a sample is set in the magnetic head measuring apparatus 10 (step S303), and an analysis item for which the magnetic head measuring device 12 inspects the magnetic head 11 is selected (step S304). As this analysis item, not only estimation of a high-frequency magnetic field distribution and local high-frequency magnetic field strength, but also reconstructing calculations of a high-frequency leakage magnetic field and horizontal magnetic field component and prediction of various electromagnetic conversion characteristics are prepared, and an arbitrary item can be selected.

Subsequently, an amplitude-modulated electric current having the carrier wave frequency ωc and the modulation frequency ωm is applied to the magnetic head (step S305), and a high-frequency magnetic field is measured with a high-frequency magnetic force microscope (step S306). A surface shape can also be measured as well as the high-frequency magnetic field. In this case, a magnetic field generation position corresponding to the surface shape can be confirmed.

The data obtained by the measurement of the high-frequency magnetic field is analyzed and evaluated (step S307). Also, whether to perform evaluation other than the measurement of the high-frequency magnetic field is checked (step S308).

If evaluation other than the measurement of the high-frequency magnetic field is to be performed, an evaluation/analysis method is selected (step S309), and the evaluation is performed by the selected method (step S310). Examples of the evaluation/analysis method are the measurement and analysis of magnetic head characteristics not obtained by the high-frequency magnetic field alone, such as the measurement of the shape or sensitivity or a reproducing portion by Magnetoresistive Sensitive Mapping (G. A. Gibson and S. Schultz IEEE Trans. Magn. 28, 2310 (1992)), and the analysis of a saturation phenomenon of a recording portion.

Next, success or failure is determined on the basis of the analysis/evaluation result (step S311). If the product has passed the inspection, acceptable product processing is performed (step S312); if the product has failed the inspection, rejected product processing is performed (step S313).

Finally, whether to terminate the measurement is checked (step S314). If the measurement is not to be terminated, the above steps are repeated; if the measurement is to be terminated, this magnetic head inspection is terminated.

This third embodiment has the effect of avoiding deterioration of a probe caused by repetitive measurements, because probes can be exchanged, in addition to the effects obtained in the second embodiment.

Fourth Embodiment

Figure 9:
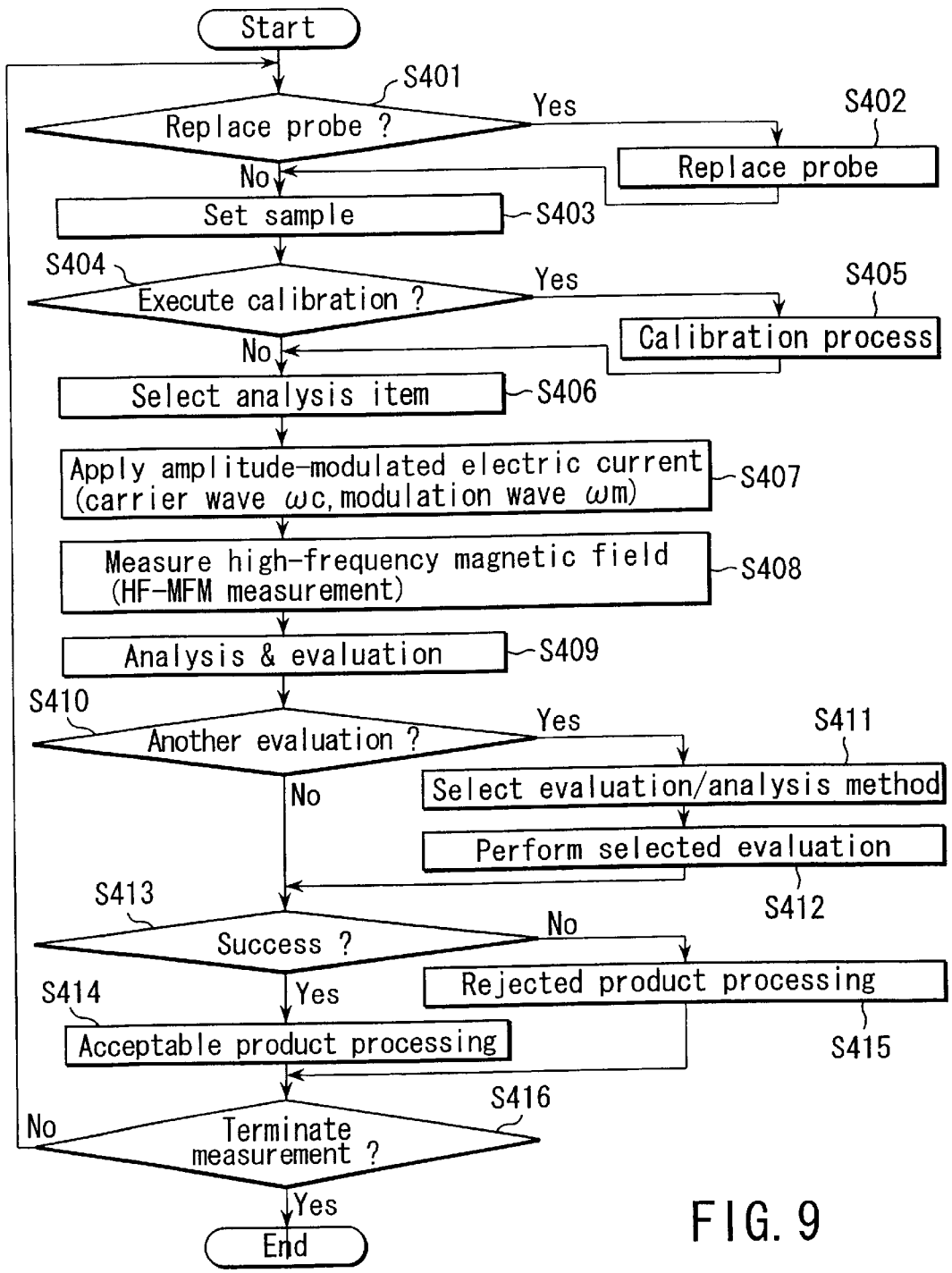
FIG. 9 is a flow chart for explaining a magnetic head inspection method according to the fourth embodiment of the present invention.

A magnetic head inspection method according to the fourth embodiment will be described below with reference to FIG. 9.

When measurements are performed while probes are exchanged as described in the third embodiment (FIG. 8), experimental results before and after the probes are exchanged are sometimes different (even when a magnetic head as a sample to be measured remains the same). As a consequence, specified inspection cannot sometimes be properly performed in a process of inspecting a large amount of magnetic heads. One reason is that the conditions (e.g., the shape, film thickness, and contamination) of a magnetic material at the tip of the MFM probe more or less change from one probe to another. Other reasons are variations in an optical system alignment for measuring the deflection of the cantilever supporting the MFM probe, and variations in the detection sensitivity caused by a difference in reflectance between thin metal films adhered to the back surface of the cantilever and required in the optical system alignment. These variations are called tip variations.

To compensate for tip variations, it is necessary to calibrate the sensitivity of the probe and normalize the obtained measurement signal. Therefore, this fourth embodiment includes a process of inspecting a large amount of magnetic heads while performing sensitivity calibration.

First, whether it is necessary to replace the probe mounted on the magnetic head measuring device 12 is checked (step S401). If replacement is necessary, the probe is replaced (step S402). Note that this replacement of the probe can be performed either manually or automatically. Note also that a probe for replacement can be saved in the magnetic head measuring apparatus 10 or supplied where necessary without being saved.

Next, the magnetic head 11 as a sample is set in the magnetic head measuring apparatus 10 (step S403).

Whether to execute calibration for eliminating measurement variations caused by tip variations is checked (step S404). If it is necessary to perform this calibration for eliminating measurement variations, a calibration process is performed (step S405).

Subsequently, an analysis item for which the magnetic head measuring device 12 inspects the magnetic head 11 is selected (step S406). As this analysis item, not only estimation of a high-frequency magnetic field distribution and local high-frequency magnetic field strength, but also reconstructing calculations of a high-frequency leakage magnetic field and horizontal magnetic field component and prediction of various electromagnetic conversion characteristics are prepared, and an arbitrary item can be selected.

An amplitude-modulated electric current having the carrier wave frequency $\omega c$ and the modulation frequency $\omega m$ is applied to the magnetic head (step S407), and a high-frequency magnetic field is measured with a high-frequency magnetic force microscope (step S408). A surface shape can also be measured as well as the high-frequency magnetic field. In this case, a magnetic field generation position corresponding to the surface shape can be confirmed.

The data obtained by the measurement of the high-frequency magnetic field is analyzed and evaluated (step S409). Also, whether to perform evaluation other than the measurement of the high-frequency magnetic field is checked (step S410).

If evaluation other than the measurement of the high-frequency magnetic field is to be performed, an evaluation/analysis method is selected (step S411), and the evaluation is performed by the selected method (step S412). Examples of the evaluation/analysis method are the measurement and analysis of magnetic head characteristics not obtained by the high-frequency magnetic field alone, such as the measurement of the shape or sensitivity or a reproducing portion by Magnetoresistive Sensitive Mapping (G. A. Gibson and S. Schultz IEEE Trans. Magn. 28, 2310 (1992)), and the analysis of a saturation phenomenon of a recording portion.

Next, success or failure is determined on the basis of the analysis/evaluation result (step S413). If the product has passed the inspection, acceptable product processing is performed (step S414); if the product has failed the inspection, rejected product processing is performed (step S415).

Finally, whether to terminate the measurement is checked (step S416). If the measurement is not to be terminated, the above steps are repeated; if the measurement is to be terminated, this magnetic head inspection is terminated.

This fourth embodiment has the effect of performing measurements by reducing the influence of tip variations, in addition to the effects obtained in the third embodiment.

As described in detail above, the invention expressed by the first to fourth embodiments can provide a magnetic head measuring apparatus and magnetic head inspection method capable of reducing measurement variations caused by tip variations and improving the yield.

Fifth Embodiment

The fifth embodiment of the present invention will be described below with reference to FIGS. 10 to 15.

Arrangement of Magnetic Recording-head Measuring Device

Figure 10:
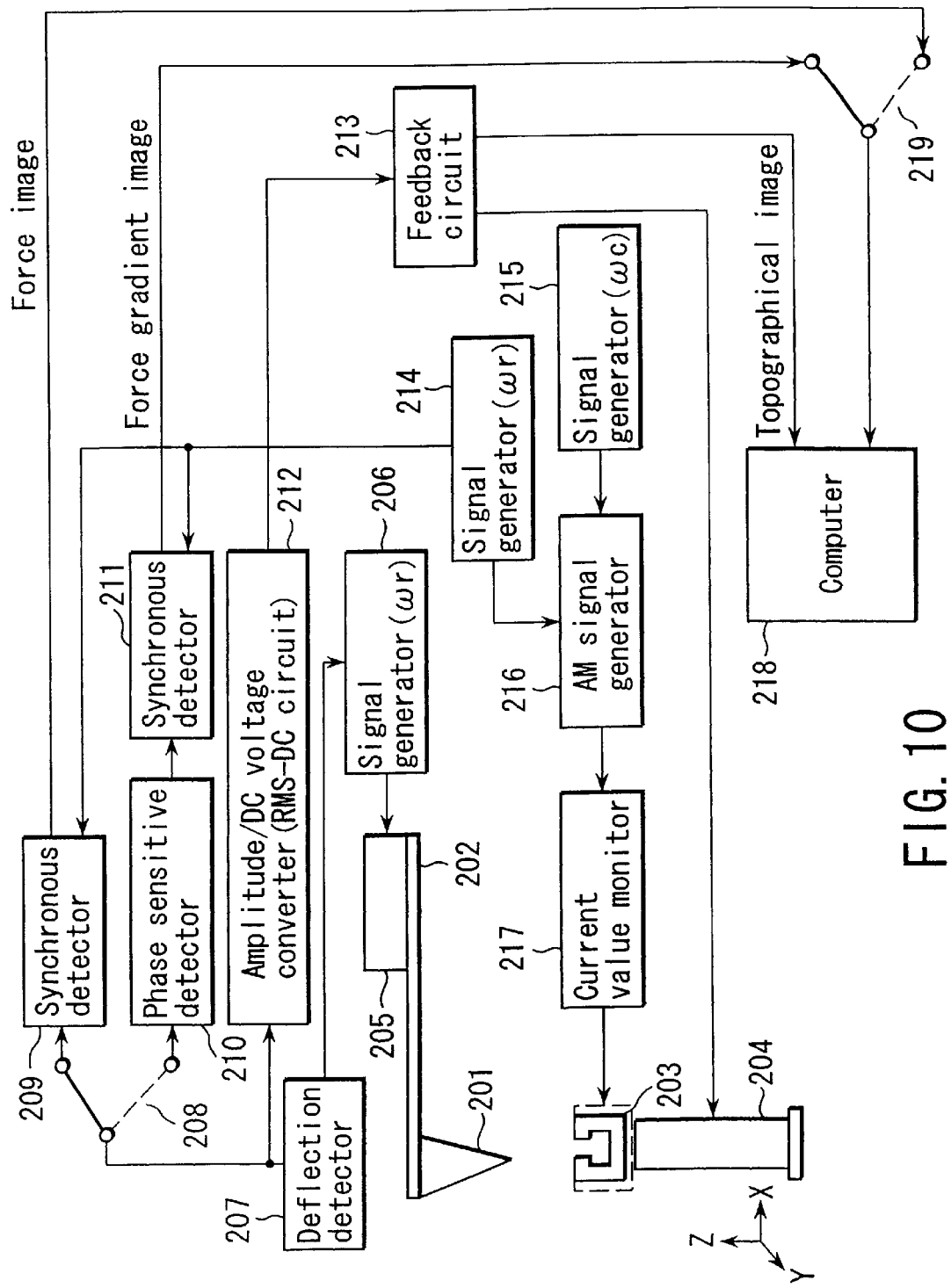
FIG. 10 is a block diagram showing the arrangement of a magnetic recording-head measuring device according to the fifth embodiment of the present invention.

FIG. 10 shows the arrangement of a magnetic recording-head measuring device according to the fifth embodiment of the present invention.

This magnetic recording-head measuring device contains a high-frequency magnetic force microscope (HF-MFM) as one form of a scanning probe microscope (SPM). Also, this measuring device allows a magnetic recording-head as a sample to generate an AM signal (amplitude-modulated signal), and measures a high-frequency (MHz to GHz) magnetic field as the force (magnetic force) acting on a probe. At the same time, the apparatus measures a topographical image of the sample.

As shown in FIG. 10, this measuring device includes a probe 201, a cantilever 202, a sample 203, a scanning piezoelectric element 204, an actuating piezoelectric element 205, a signal generator 206, a deflection detector 207, a switch 208, a synchronous detector 209, a phase sensitive detector 210, a synchronous detector 211, an amplitude/DC voltage converter (RMS-DC circuit) 212, a feedback circuit 213, a first signal generator 214, a second signal generator 215, an AM signal generator (amplitude-modulated signal generator) 216, a current value monitor 217, a computer 218, and a switch 219.

The probe 201 is magnetized by coating of a magnetic substance and attached to the front end of the cantilever 202.

The cantilever 202 supports the probe 201 and has a mechanical resonance frequency $\omega r$.

The sample 203 is a magnetic recording-head and generates a high-frequency magnetic field under specific conditions.

The scanning piezoelectric element 204 controls the driving of the sample 203 in the X-, Y-, and Z-axis directions, thereby changing the relative positional relationship between the probe 201 and the sample 203.

The actuating piezoelectric element 205 is attached to the rear end of the cantilever 202 and applies a vibration to the cantilever 202.

The signal generator 206 drives the actuating piezoelectric element 205 to apply a vibration with specified vibration amplitude to the cantilever 202.

The deflection detector 207 includes a laser light source, photodiode, and the like, and detects the deflection of the cantilever 202.

The switch 208 switches the output destinations of a detection signal from the deflection detector 207 in accordance with whether to perform force measurement or force gradient measurement.

The synchronous detector 209 constructs a force measurement system and detects the vibration amplitude (the AC component of deflection) of the cantilever 202.

The phase sensitive detector 210 constructs a force gradient measurement system together with the synchronous detector 211, and detects a phase difference (phase shift) between the vibration amplitude of the signal generator 206 and the vibration amplitude of the cantilever 202.

The synchronous detector 211 constructs the force gradient measurement system together with the phase sensitive detector 210, and detects the AC component (the sideband component of AM modulation) of an output from the phase sensitive detector 210.

Note that in the force gradient measurement system, a feedback loop may be formed by deflection detector 207→signal generator 206→actuating piezoelectric element 205→cantilever 202 to measure an amount (frequency shift) corresponding to a change in resonance frequency while the cantilever 202 is vibrating at specified amplitude (frequency detecting method).

The amplitude/DC voltage converter 212 measures the effective value of the deflection detector 207.

The feedback circuit 213 drives the scanning piezoelectric element 204 on the basis of an output from the amplitude/DC voltage converter 212 to perform control such that the output from this amplitude/DC voltage converter 212 is constant. Also, the feedback circuit 213 drives the scanning piezoelectric element 204 to move the sample 203 in the X-, Y-, and Z-axis directions, and outputs to the computer 218 a signal (digital data) indicating a topographical image of the sample 203 on the basis of the output from the amplitude/DC voltage converter 212.

The signal generator 214 sets a sideband frequency (modulation frequency) $\omega m$ of an AM signal, and generates a signal to which $\omega m$ is set.

The signal generator 215 sets a carrier wave frequency $\omega c$ (>>$\omega r$) of an AM signal, and generates a signal to which $\omega c$ is set.

The AM signal generator 216 generates an AM signal based on the output signals from the signal generators 214 and 215.

The current value monitor 217 has a function of measuring the value of an electric current applied from the AM signal generator 216 to the sample 103, and adjusting this electric current.

The computer 218 controls the overall measuring device. This computer 218 has a function of inputting and saving the conditions of an electric current generated from the AM signal generator 216, and a function of monitoring and controlling the states of the AM signal generator 216 and the current value monitor 217. The computer 218 also has a function of saving, in the same file, the conditions of an electric current to be applied to the sample 203 and measurement data in one-to-one correspondence with each other.

Furthermore, the computer 218 has a function of calculating differences between a plurality of obtained images to specify a magnetic field position, and effectively displaying the contrast of that portion. For example, the computer 218 performs subtraction for images different in the value of an electric current to be applied to the sample 203, thereby specifying a portion where a change in the magnetic field strength is large. In addition, the computer 218 can visually display a magnetic field generation position by changing the contrast of that portion.

Also, the computer 218 measures a force image on the basis of an output signal from the synchronous detector 209 constructing the force measurement system, and measures a force gradient image on the basis of an output signal from the synchronous detector 211 constructing the force gradient measurement system (a display process and saving process are included). The force image and the force gradient image are high-frequency head images relating to the magnetic force of a high-frequency magnetic field generated by a magnetic recording-head. The computer 218 selectively performs force measurement and force gradient measurement by switching the switches 208 and 219.

The switch 219 collaborates with the switch 208 to switch signal input destinations in accordance with whether to perform force measurement or force gradient measurement.

Conditions of Cantilever

Figure 11:
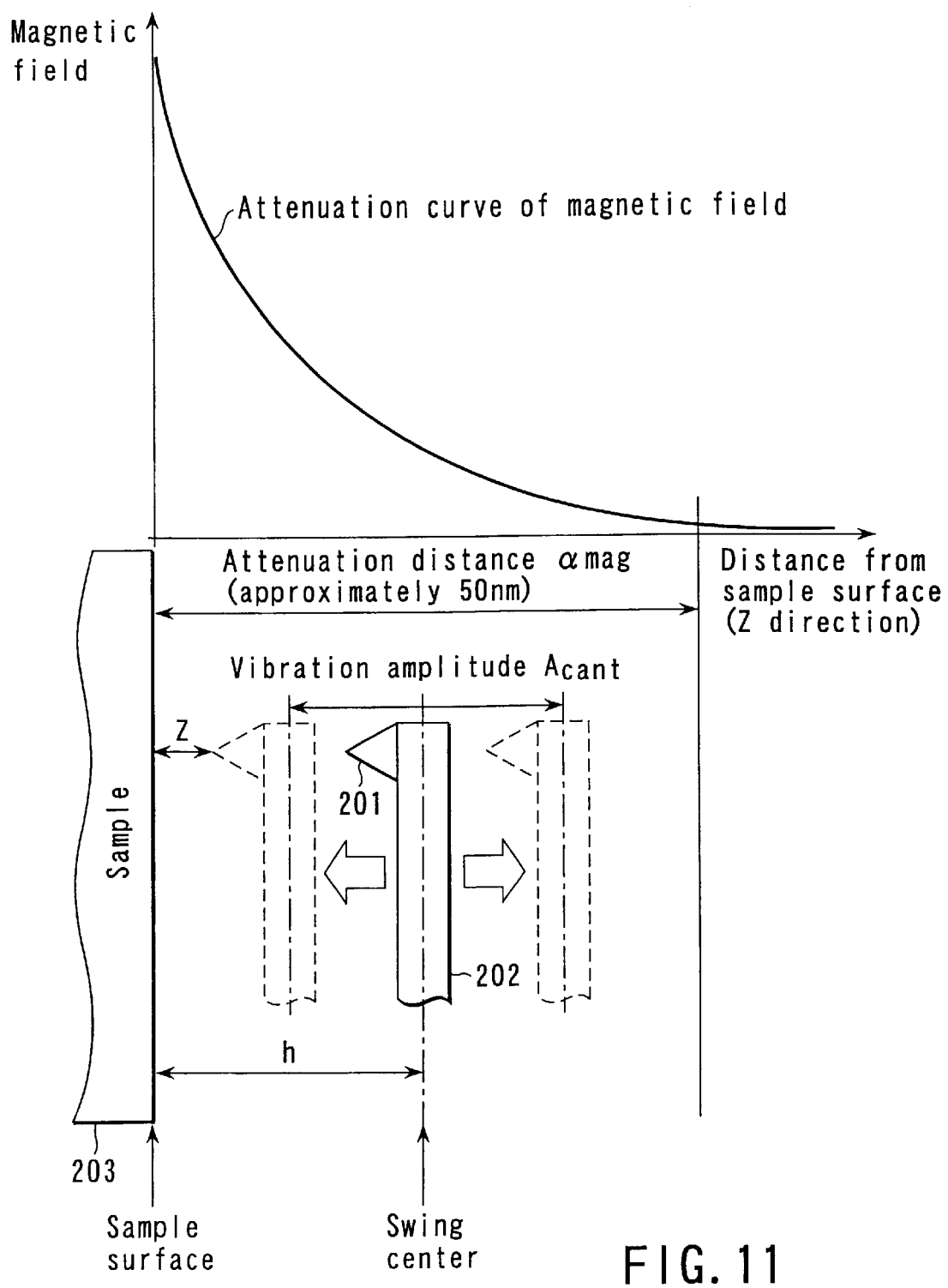
FIG. 11 is a view for explaining the conditions of a cantilever of the fifth embodiment.

FIG. 11 is a view for explaining the conditions of the cantilever.

To improve the spatial resolution during measurements, as shown in FIG. 11, it is desirable to set a vibration amplitude Acant in the direction of height (Z direction) of the cantilever 202 as large as possible provided that the probe 201 does not hit the surface of the sample 203. That is, the difference between the square value of a distance h from the surface of the sample 203 to the vibration center of the cantilever 202 and the vibration amplitude Acant of the cantilever 202 is desirably as close to 0 as possible, that is, $$2h - Acant \to 0 \qquad (1)$$

where, Acant<2h

Note that the distance h can be adjusted by moving the scanning piezoelectric element 204 in the Z-axis direction (direction of height).

However, if the probe 201 is moved too close to the surface of the sample 203 in order to improve the spatial resolution (i.e., if an interval (probe-to-sample distance) z between the sample 203 and the probe 201 is too small), the tip of the probe 201 is attracted to the sample 203 (the probe-to-sample distance when this attraction occurs changes in accordance with the material of the sample 203 and the type of excitation field). That is, if a Van der Walls force gradient acting on the probe 201 becomes larger than the spring constant of the cantilever 202, this cantilever 202 can no longer support the probe 201. As a consequence, the probe 201 jumps onto the surface of the sample 203 to make measurement difficult (Seizo Morita, K BOOKS SERIES 83, "All About Scanning Probe Microscope" (KOGYO CHOSAKAI) 1992). Accordingly, a spring constant kcant of the cantilever 202 is desirably larger than the Van der Waals force gradient as indicated by $$k_{cant} > \delta F_{vdw}/\delta z \quad (2)$$

where Fvdw is the Van der Waals force acting on the probe 201, and z is the probe-to-sample distance.

In a dynamic mode in which a dynamic interaction caused by a magnetic field is measured while the cantilever 202 is vibrating, this dynamic interaction is represented by the average of the probe 201 and the magnetic force of the magnetic field at each point of vibration (F. J. Giessibl, Physical Review B56 (19979 16010). Therefore, if the vibration amplitude Acant is larger than an attenuation distance αmag, a place where the probe 201 does not interact with the magnetic field exists, so no efficient measurement can be performed. The "attenuation distance" is the distance from the surface of the sample 203 to a point at which the probe 202 does not interact with the magnetic field any longer.

Accordingly, to further increase the efficiency of detection of the dynamic interaction, it is necessary to eliminate the place where the probe 201 does not interact with the magnetic field. In other words, while the probe 201 is scanned to measure the dynamic interaction caused by the magnetic field, it is necessary to set the vibration range of this probe 201 within the range from the surface of the sample 203 to the point at which the probe 201 does not interact with the magnetic field any longer. To this end, the vibration amplitude Acant of the cantilever 202 must be made smaller than the attenuation distance αmag of the magnetic field as indicated by $$A_{cant} < \alpha_{mag} \quad (3)$$

Since the attenuation distance αmag of the magnetic field is about 50 nm, the vibration amplitude Acant of the cantilever 202 is desirably set to less than 50 nm.

When the cantilever 202 is set under the conditions as described above, a high-frequency response can be stably measured with high resolution.

Measurement Method

Figure 12:
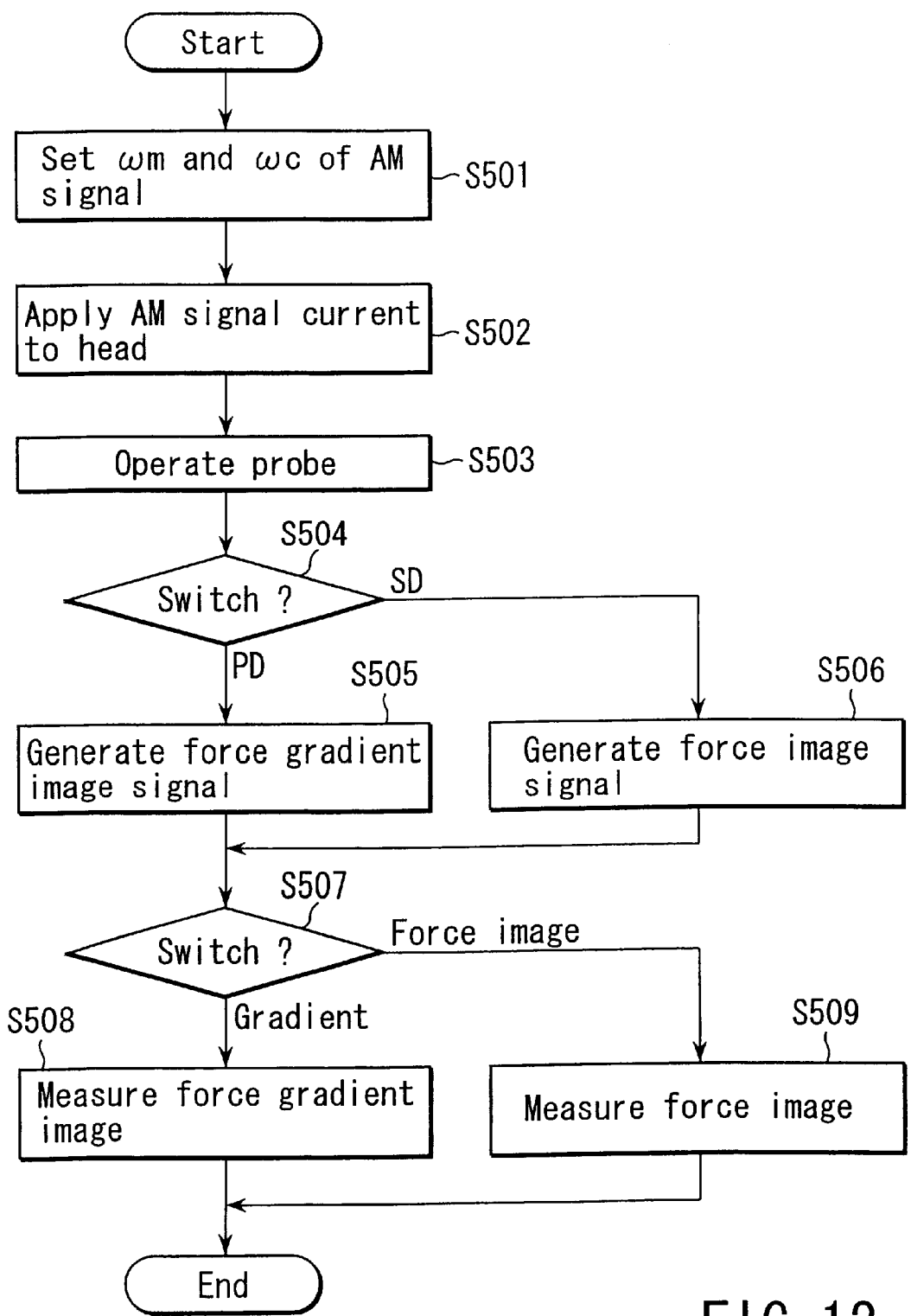
FIG. 12 is a flow chart for explaining a measurement method of the fifth embodiment.

A measurement method of this embodiment will be explained below with reference to FIG. 10 and a flow chart in FIG. 12.

First, the sample 203 as a magnetic recording-head to be measured is placed on a specific member to be driven by the scanning piezoelectric element 204.

The sideband frequency ωm and the carrier wave frequency ωc of an AM signal to be generated from the AM signal generator 216 are set (step S501). An AM signal current whose amplitude is modulated by these ωc and ωm is generated from the AM signal generator 216 and applied to the sample 203 (step S502).

In the above settings, the sideband frequency ωm is set under the condition "ωm<<ωr". In this case, the sideband frequency ωm is preferably set to be 1/10 the resonance frequency ωr of the cantilever 202 or less. This is so because there is the limitation in modulation theory and circuit configuration that the maximum frequency of an AC component detected by the phase sensitive detector 210 is approximately 1/10 the resonance frequency of the cantilever or less.

Also, the carrier wave frequency ωc is set to a value (a few MHz to GHz) higher than the resonance frequency ωr of the cantilever 202. If measurement is performed by setting this carrier wave frequency ωc in the vicinity of the resonance frequency ωr of the cantilever 202, the cantilever 202 itself stores energy acting on the probe 201. This makes accurate image measurement impossible. Furthermore, if the carrier wave frequency ωc is set to be smaller than the resonance frequency ωr, no high-frequency measurement can be performed any longer.

Next, the cantilever 202 is set under the conditions meeting expressions (1) to (3) above and vibrates, and the surface of the sample 203 is scanned by the probe 201 while the relative positional relationship between the probe 201 and the sample 203 are changed (step S503). During the scan, the cantilever 202 is actuated at specified vibration amplitude by applying a specific signal (e.g., a signal having a frequency close to the resonance frequency ωr of the cantilever 202) from the signal generator 206 to the actuating piezoelectric element 205.

Consequently, a dynamic interaction caused by a magnetic field generated from the sample 203 acts on the probe 201. More specifically, a force and force gradient having a low-frequency AC component (ωm component) act on the probe 201. This ωm component contains a high-frequency ωc component. The value of ωm is much smaller than the resonance frequency of the cantilever 202 and hence can be detected relatively easily. Therefore, the high-frequency magnetic field distribution of the sample 203 can be measured by setting the value of the carrier wave frequency ωc at a few MHz to GHz. That is, the high-frequency component (carrier wave component) of the dynamic interaction acting on the probe 201 can be measured by converting this high-frequency component into the low-frequency component (sideband component).

The deflection detector 207 detects the force and force gradient as the deflection of the cantilever 202. The computer 218 receives a signal of a topographical image of the sample 203 from the measurement system including the deflection detector 207, the amplitude/DC voltage converter 212, and the feedback circuit 213, thereby measuring this topographical image. In addition, the computer 218 selectively measures the force image and force gradient image by controlling the switches 208 and 219.

If the computer 218 connects the switch 208 to the phase sensitive detector 210 (PD) ("PD" in step S504), this phase sensitive detector 210 and the synchronous detector 211 generate a signal of the force gradient. If the computer 218 connects the switch 208 to the synchronous detector 209 (SD) ("SD" in step S504), this synchronous detector 209 generates a signal of the force image.

The force gradient image signal generated by the phase sensitive detector 210 and the synchronous detector 211 is loaded into the computer 218 via the switch 219 ("Gradient" in step S507). The force image signal generated by the synchronous detector 209 is loaded into the computer 218 via the switch 219 ("Force image" in step S507).

The computer 218 measures the force gradient image when loading the force gradient image signal (step S508), and measures the force image when loading the force image signal (step S509).

As described above, this measuring device can measure the topographical image of the sample 203 and at the same time can selectively measure the force image and the force gradient image. Also, by switching the switches 208 and 219, a high-frequency force image and force gradient image in the same field of view can be compared under the same conditions.

Note that in high-frequency magnetic field measurement, if the strength of the magnetic field from the magnetic recording-head is too large, the surface shape is influenced by this magnetic field. When this is the case, the vibration frequency or vibration amplitude of the cantilever 202 is preferably controlled on the basis of the contrast of the obtained surface shape. For example, the vibration frequency of the cantilever 202 is shifted from the resonance frequency ωr or the vibration amplitude of the cantilever 202 is increased by adjusting the actuating piezoelectric element 205 or the signal generator 206. Accordingly, measurement can be performed with the influence of the strong magnetic field reduced.

In the measuring device of the fifth embodiment described above, while the conditions of the cantilever 202 are appropriately set, an amplitude-modulated, high-frequency electric current is applied to a magnetic recording-head to be measured, thereby generating a magnetic field. This can realize measurement of a high-frequency response with improved spatial resolution.

FIGS. 13A to 14C are graphs showing measurement examples when a force gradient image and a force image of a magnetic recording-head are measured using the measuring device of the above embodiment.

Figure 15:
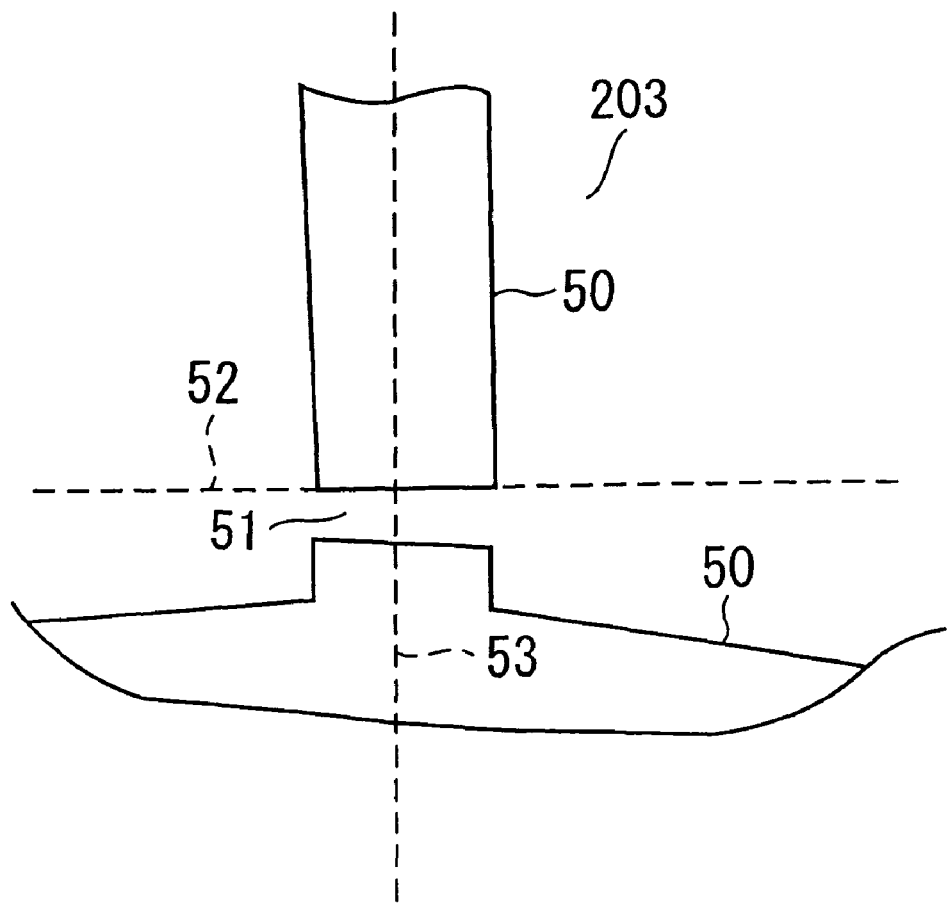
FIG. 15 is a view showing the relationship between the gap position and profile of a sample in the measurement examples of the fifth embodiment.

FIG. 13A is a force gradient image as a high-frequency head image obtained by the force gradient measurement system of the measuring device of the embodiment. FIGS. 13B and 13C depict line profiles. As shown in FIG. 15, the magnetic recording-head (sample 203) to be measured has a gap 51 between magnetic poles 50. Also, the value (amplitude) of a signal current applied from the current value monitor 17 to the sample is 20 mA. Furthermore, the carrier wave frequency of an AM signal for generating this signal current is "ωc=2π×10 MHz", and the sideband frequency of this AM signal is "ωm=2π×300 Hz". The operation range of the probe 201 is "5 μm×5 μm". A range 30 in FIG. 13A corresponds to the position of the gap 51 of the magnetic recording-head, meaning that a high-frequency magnetic field is large in this portion. FIG. 13B is a line profile (corresponding to a line 52 in FIG. 15) indicating that the magnetic field is large in the vicinity of the gap position. FIG. 13C is a line profile (corresponding to a line 53 in FIG. 15) indicating peaks 31 presumably generated by the effect of loss by excess current on the edges of the gap.

Figure 14A:
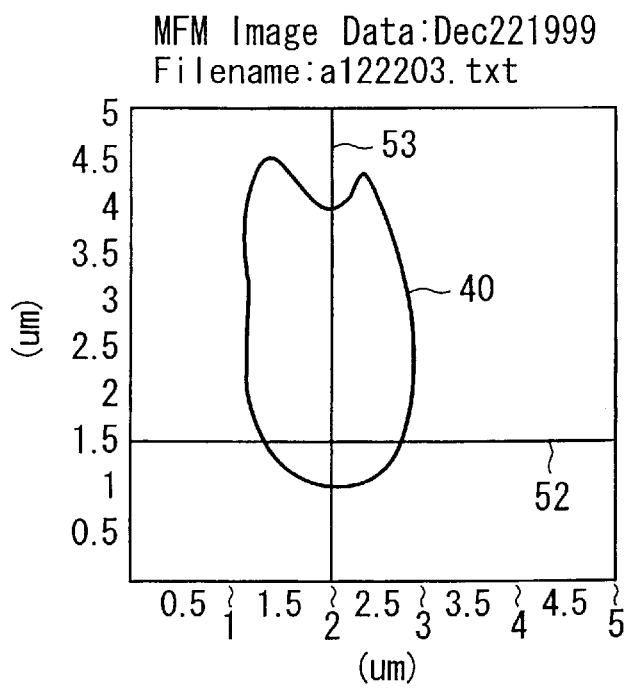
FIGS. 14A to 14C are graphs showing a force image measurement example of the fifth embodiment.
Figure 14B:
Figure 14C:

FIG. 14A is a force image as a high-frequency head image obtained by the force measurement system of the measuring device of the embodiment. FIGS. 14B and 14C depict line profiles (corresponding to the lines 52 and 53, respectively, in FIG. 15). The magnetic recording-head 203 to be measured and the probe 201 are the same as in the measurement example in FIGS. 13A to 13C. The measurement conditions are also the same except that the sideband frequency of the AM signal is "ωm=2π×47.2 kHz (=ωr)". A range 40 in FIG. 14A corresponds to the gap position of the magnetic recording-head, meaning that a high-frequency magnetic field is large in this portion. FIG. 14B is a line profile indicating that the magnetic field is large in the vicinity of the gap position. A change in the contrast is moderate compared to FIG. 13B, indicating that the resolution is low. FIG. 14C shows that there are no peaks 31, shown in FIG. 13C, presumably generated by the effect of loss by an excess current on the edges of the gap.

From the above measurement results, the force gradient measurement system has a higher resolution than that of the force measurement system and, therefore, can measure an image well reflecting a high-frequency magnetic field generated from a magnetic recording-head.

As described in detail above, the invention expressed by the fifth embodiment can provide a magnetic recording-head measuring device capable of measuring a high-frequency response at high sensitivity and high resolution.

Additional advantages and modifications will readily occur to those skilled in the art. Therefore, the invention in its broader aspects is not limited to the specific details and representative embodiments shown and described herein. Accordingly, various modifications may be made without departing from the spirit and scope of the general inventive concept as defined by the appended claims and their equivalents.

What is claimed is:

1. A magnetic head measuring apparatus for measuring a magnetic head, comprising:
    a calibrating magnetic field generating source which causes the magnetic head to generate a magnetic field having a constant strength and frequency;
    an electric current applying device which applies an amplitude-modulated electric current whose amplitude is modulated by a specified carrier wave frequency and modulation frequency, to the magnetic head from which the magnetic field is generated by the calibrating magnetic field generating source; and
    a magnetic head measuring device which measures a high-frequency magnetic field generated from the magnetic head by application of the amplitude-modulated electric current from the electric current applying device.

2. The apparatus according to claim 1, wherein the magnetic head measuring device includes an interchangeable magnetic material probe partially or entirely made of a magnetic material.

3. The apparatus according to claim 1, wherein the electric current applying device is capable of applying a direct current.

4. The apparatus according to claim 1, wherein the electric current applying device is capable of applying an alternate current.

5. The apparatus according to claim 1, wherein the electric current applying device applies an electric current having a current density of not more than $10^{-8}$ A/cm$^2$.

6. The apparatus according to claim 1, wherein the calibrating magnetic field generating source includes an annular conductor and is capable of applying an electric current to the magnetic head.

7. The apparatus according to claim 1, wherein the calibrating magnetic field generating source includes a linear conductor and is capable of applying an electric current to the magnetic head.

8. The apparatus according to claim 1, wherein the calibrating magnetic field generating source is capable of applying an electric current and from which the magnitude of a magnetic field corresponding to the applied current is capable of being estimated.

9. The apparatus according to claim 1, wherein the calibrating magnetic field generating source includes a magnetic head.

10. The apparatus according to claim 1, wherein the calibrating magnetic field generating source is capable of applying a direct current to the magnetic head.

11. The apparatus according to claim 1, wherein the calibrating magnetic field generating source is capable of applying an alternate current to the magnetic head.

12. The apparatus according to claim 1, wherein the calibrating magnetic field generating source applies an electric current having a current density of not more than $10^{-8}$ A/cm$^2$.

13. The apparatus according to claim 1, further comprising:

a direct current application source which applies a direct current to the magnetic head;

a voltage measuring unit which measures a voltage of the magnetic head to which the direct current is applied by the direct current application source; and a synchronous detector which synchronously detects a specified frequency component of an output voltage from the voltage measuring unit.

14. The apparatus according to claim 1, further comprising:

an electric current application source which applies to the magnetic head an electric current which is a sum of a direct current and an alternate current; and a synchronous detector which synchronously detects at a specified frequency a specific signal output from the magnetic head measuring device.

15. A method of inspecting a magnetic head, comprising:

setting the magnetic head;

selecting an analysis item for which the magnetic head is to be inspected;

applying to the magnetic head an amplitude-modulated electric current whose amplitude is modulated by a specified carrier wave frequency and modulation frequency;

measuring, in accordance with the selected analysis item, the magnetic head to which the amplitude-modulated electric current is applied, by using a high-frequency magnetic force microscope;

analyzing and evaluating data, obtained by the measurement, of the magnetic head; and determining success or failure of the magnetic head on the basis of the evaluation result.

16. The method according to claim 15, further comprising:

applying a constant current to the magnetic head; and measuring a voltage of the magnetic head to which the constant current is applied.

17. The method according to claim 15, further comprising synchronously detecting a specified frequency component of an output voltage obtained by the measurement.

18. The method according to claim 15, further comprising exchanging probes for use in measurement of the magnetic head.

19. The method according to claim 15, further comprising calibrating measurement variations of the magnetic head.

20. A magnetic recording-head measuring apparatus for measuring a magnetic recording-head, comprising:

an electric current applying device which applies to the magnetic recording-head an amplitude-modulated electric current whose amplitude is modulated by a specified carrier wave frequency and modulation frequency;

a cantilever to which a probe having a magnetic material is attached;

a vibrator which applies a vibration with specified vibration amplitude to the cantilever; and a measuring device which measures a dynamic interaction which a magnetic field generated in the magnetic recording-head by application of the amplitude-modulated electric current from the electric current applying means exerts on the probe vibrating, wherein while the probe is scanned to measure the dynamic interaction by the magnetic field, a vibration range of the probe falls within a range from a surface of the magnetic recording-head to a point at which the probe does not interact with the magnetic field any longer.

21. The apparatus according to claim 20, wherein the vibration amplitude of the cantilever is less than 50 nm.

22. The apparatus according to claim 20, wherein a spring constant of the cantilever is larger than a Van der Waals force gradient acting on the probe.

23. The apparatus according to claim 20, wherein the vibrator is capable of adjusting at least one of the vibration frequency and vibration amplitude of the cantilever.

24. A method of measuring a magnetic recording-head, comprising:

applying to the magnetic recording-head an amplitude-modulated electric current whose amplitude is modulated by a specified carrier wave frequency and modulation frequency;

applying a vibration with specified vibration amplitude to a cantilever to which a probe having a magnetic material is attached; and measuring a dynamic interaction which a magnetic field generated in the magnetic recording-head by application of the amplitude-modulated electric current exerts on the probe which vibrates together with the cantilever, wherein while the probe is scanned to measure the dynamic interaction by the magnetic field, a vibration range of the probe falls within a range from a surface of the magnetic recording-head to a point at which the probe does not interact with the magnetic field any longer.

25. The method according to claim 24, wherein the vibration amplitude of the cantilever is less than 50 nm.

26. The method according to claim 24, wherein a spring constant of the cantilever is larger than a Van der Waals force gradient acting on the probe.

27. The method according to claim 24, wherein at least one of the vibration frequency and vibration amplitude of the cantilever is adjusted.

* * * * *